United States Patent
Kasuga et al.

[11] Patent Number: 6,081,063
[45] Date of Patent: Jun. 27, 2000

[54] ULTRASONIC MOTOR AND ELECTRONIC APPARATUS HAVING ULTRASONIC MOTOR

[75] Inventors: Masao Kasuga; Akihiro Iino; Makoto Suziki; Kenji Suzuki, all of Chiba, Japan

[73] Assignee: Seiko Instruments Inc., Japan

[21] Appl. No.: 09/078,471

[22] Filed: May 14, 1998

[30] Foreign Application Priority Data

May 16, 1997 [JP] Japan ................................ 9-127596
Apr. 13, 1998 [JP] Japan ................................ 10-101570

[51] Int. Cl.[7] ................................................. H01L 41/08
[52] U.S. Cl. ........................ 310/323.02; 310/323.12; 310/323.16
[58] Field of Search .................. 310/323.02, 323.12, 310/323.16, 328

[56] References Cited

U.S. PATENT DOCUMENTS

| | | | |
|---|---|---|---|
| 5,345,137 | 9/1994 | Funakubo et al. | 310/323 |
| 5,453,653 | 9/1995 | Zumeris | 310/323 |
| 5,616,980 | 4/1997 | Zumeris | 310/323 |
| 5,682,076 | 10/1997 | Zumeris | 310/323 |
| 5,877,579 | 3/1999 | Zumeris | 310/317 |

FOREIGN PATENT DOCUMENTS

| | | |
|---|---|---|
| 725476A1 | 8/1996 | European Pat. Off. . |
| 3833342 | 5/1990 | Germany . |
| 2-007875 | 6/1988 | Japan . |
| 2-041673 | 7/1988 | Japan . |

OTHER PUBLICATIONS

Patent Abstracts of Japan, vol. 018, No. 137 (E–1518) Mar. 7, 1994.
Patent Abstracts of Japan, vol. 097, No. 009 Sep. 30, 1997.

*Primary Examiner*—Nestor Ramirez
*Assistant Examiner*—Peter Medley
*Attorney, Agent, or Firm*—Adams & Wilks

[57] ABSTRACT

An ultrasonic motor has at least one piezoelectric flexing vibration member driven by application of a voltage thereto to undergo flexing vibration. A piezoelectric stretching vibration member is integrally laminated in a lamination direction on the piezoelectric flexing vibration member and is driven by application of a voltage thereto to undergo stretching vibration in a direction generally perpendicular to the lamination direction. A movable body is vibrationally driven by a combination of the flexing vibration of the piezoelectric flexing vibration member and the stretching vibration of the piezoelectric stretching vibration member.

24 Claims, 10 Drawing Sheets

FIG. 4
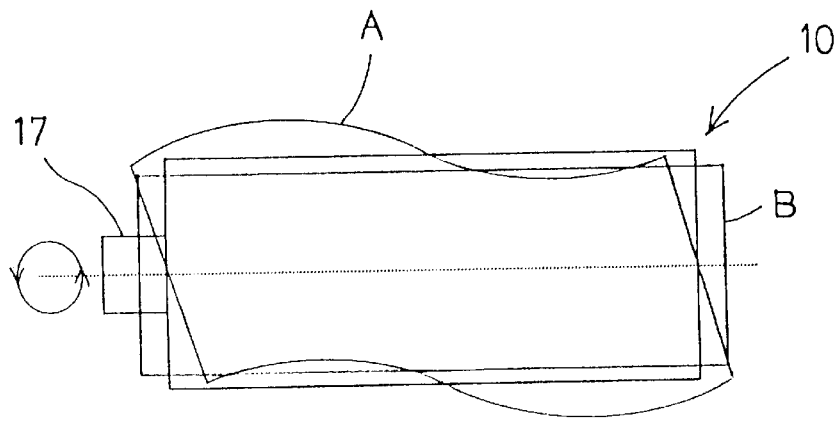
FIG. 5A
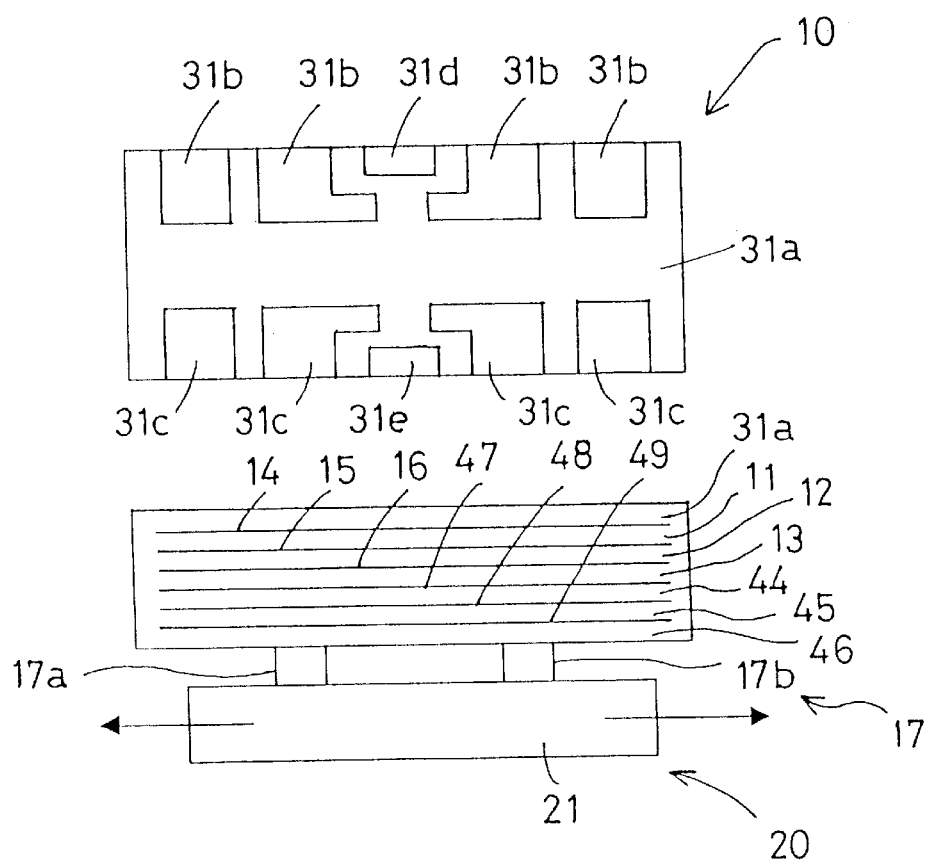
FIG. 5B

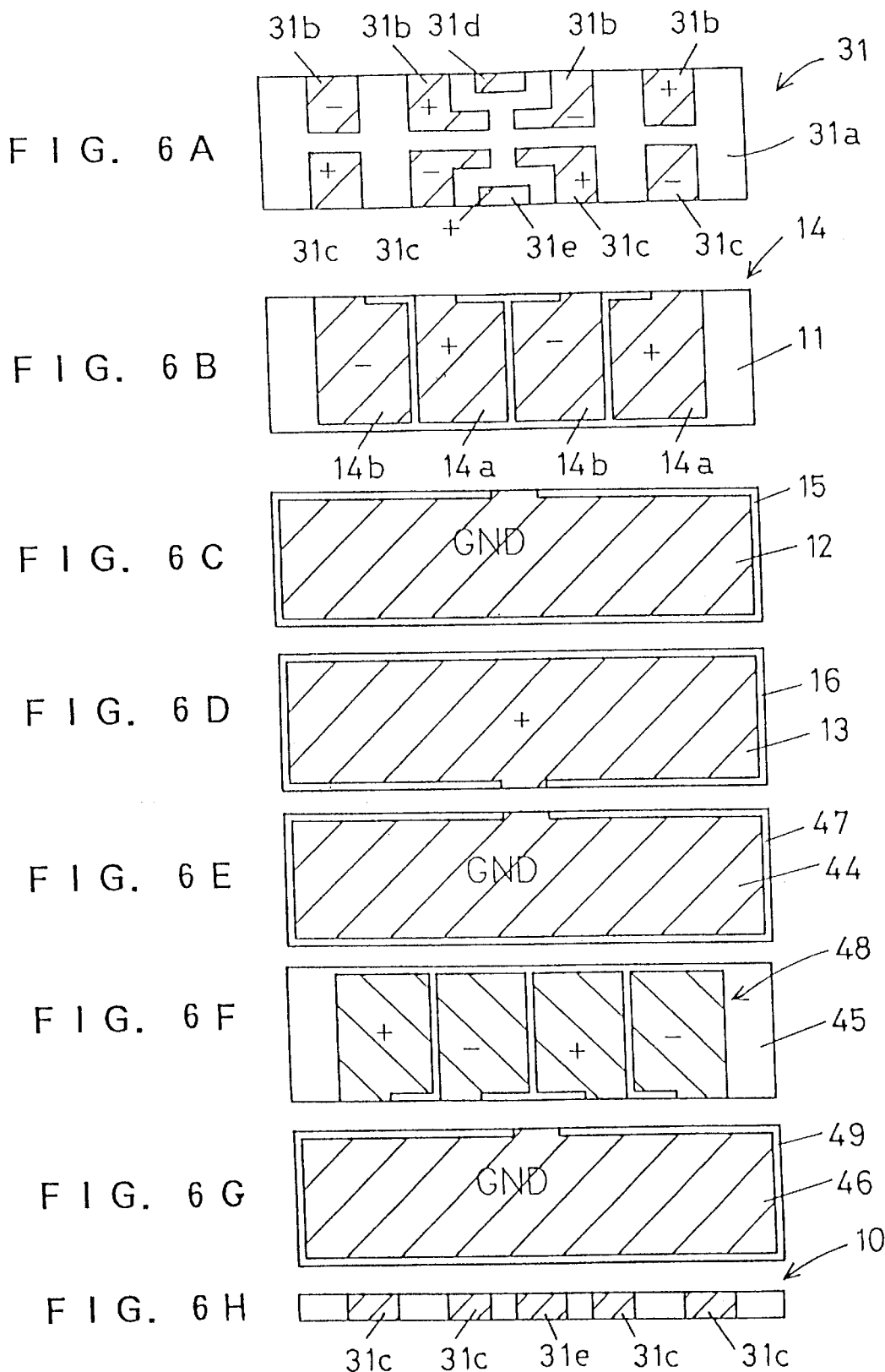

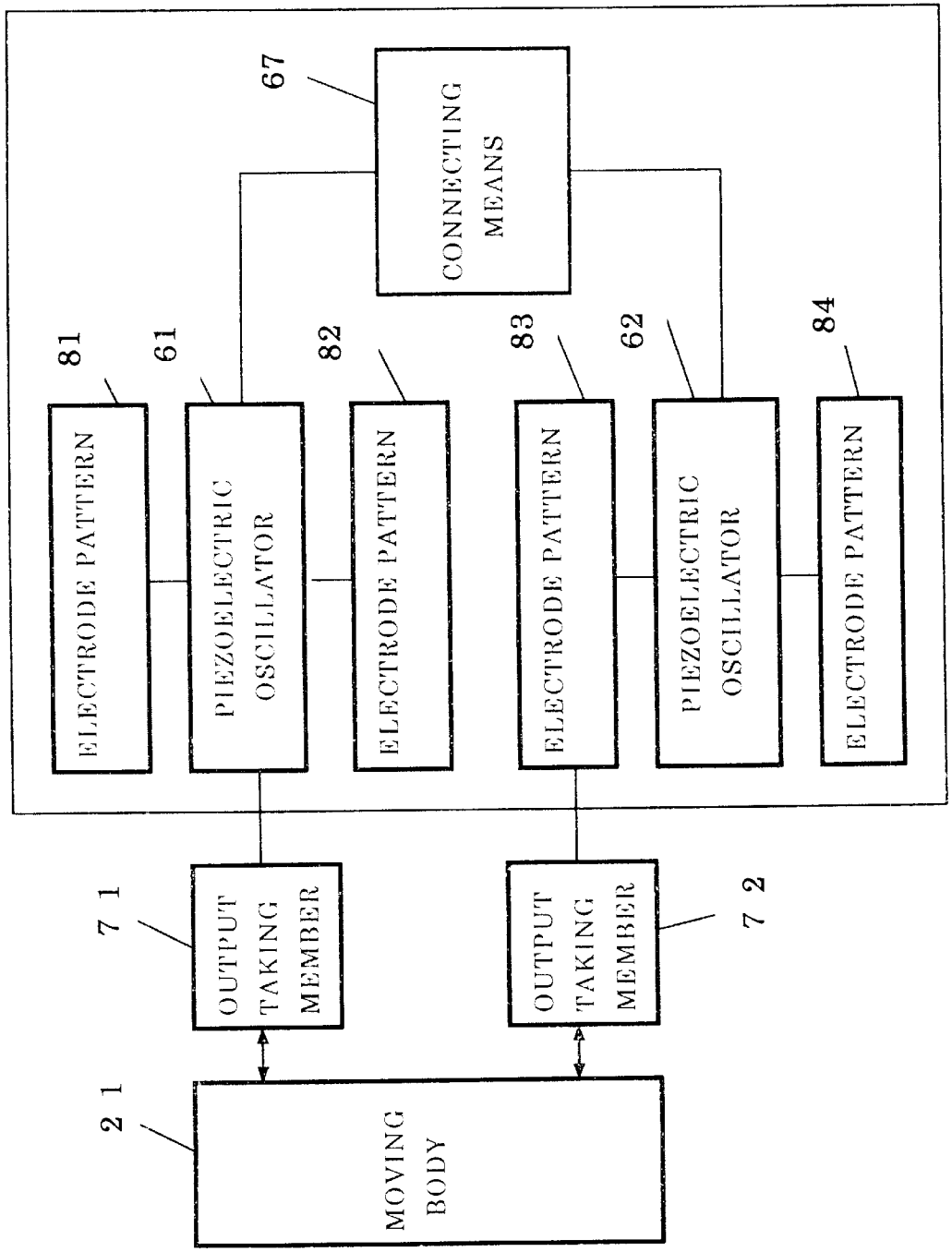

ULTRASONIC MOTOR AND ELECTRONIC APPARATUS HAVING ULTRASONIC MOTOR

BACKGROUND OF THE INVENTION

The present invention relates to an ultrasonic motor wherein piezoelectric vibration members are laminated one upon another and, more particularly, to an improvement of a type of ultrasonic motor that uses no retaining means when the piezoelectric vibration members are laminated. The present invention also relates to an electronic apparatus having the ultrasonic motor.

Recently, attention has been drawn, in the field of a micromotor, toward an ultrasonic motor wherein a moving body is moved using a piezoelectric vibrator that vibrates due to the application of a voltage.

Particularly, an ultrasonic motor that uses a stretching vibration and a flexing vibration of a rectangular piezoelectric vibrator (dual-mode vibrator) is used for various purposes because this synthetic vibration is used to cause straight-line movements, rotary movements, etc. of a moving body. Further, piezoelectric vibrators which are laminated are also used in devices which require a high output (see Japanese Patent Application Laid-Open Publication No. Hei-7-184382).

FIG. 10 illustrates a type of ultrasonic motor wherein rectangular piezoelectric vibrators are laminated.

Namely, a basic vibrator of the ultrasonic motor is comprised of piezoelectric oscillators 61 and 62 with respect to which a prescribed polarization processing is performed for vibrating each of them in two modes, output taking members 71 and 72 which have been provided at forward ends of the piezoelectric oscillators 61 and 62, and electrodes which have been provided on both surfaces of each of the piezoelectric oscillators 61 and 62. The piezoelectric oscillators 61 and 62 are stacked vertically in three stages and arranged laterally in two rows, and these six piezoelectric vibrators are retained by connecting means 67a and 67b.

FIG. 11 is a block diagram illustrating a basic structure of the above-described ultrasonic motor.

According to this structure, the piezoelectric oscillators 61 and 62 are dual-mode vibrated by being applied with a voltage from electrode patterns 81 and 82, respectively, this synthetic vibration is transmitted to each of the respective output taking members 71 and 72, and a moving body 21 is moved which is kept in abutment with the output taking members 71 and 72.

By this construction, since the output is taken out from a plurality of the output taking members 71 and 72, a high output is obtained.

However, according to the above-described ultrasonic motor, since respective parts of the piezoelectric oscillators 61 and 62 are only fixed by the connecting means 67, there exists the technical problem that a vibration-directional dispersion occurs between the respective piezoelectric oscillators 61 and 62 and also, since the vibration movements are suppressed at the respective fixed portions of the piezoelectric oscillators 61 and 62, a loss of the vibration movement occurs with the result that the output cannot be taken out effectively.

Furthermore, when the connecting means 67 which is a separate member is used for fixing the piezoelectric oscillators 61 and 62, the construction of the entire motor becomes undesirably large in size and complex and, since the step of mounting the connecting means 67 is added, the manufacturing process becomes complex.

Meanwhile, in the respective piezoelectric oscillators 61 and 62, each of which makes its dual-mode vibrations, a voltage is applied to prescribed polarization processed portions thereof for the purpose of changing over the movement direction of the motor through the flexing vibrations. Therefore, there exists the technical problem that the stretching vibrations which are incidentally caused cannot be enlarged compared to the flexing vibrations which are forcedly caused.

SUMMARY OF THE INVENTION

It is an object of the present invention to provide an ultrasonic motor which prevents the dispersion in the vibration direction and the vibration loss of the laminated piezoelectric vibrator, miniaturizes and simplifies the laminated structure, and increases the output of the synthetic vibration. Another object of the present invention is to provide an electronic apparatus using the ultrasonic motor.

BRIEF DESCRIPTION OF THE DRAWINGS

FIG. 4 is an explanatory view showing modes of vibration associated with FIGS. 1A and 1B;

FIG. 5A is an explanatory view showing a planar structure of a second embodiment wherein the present invention has been applied to an ultrasonic motor, and FIG. 5B is an explanatory view showing a sectional structure thereof;

FIGS. 6A,6B,6C,6D,6E,6F,6G and 6H are explanatory views showing planar structures of the respective laminated layers of FIGS. 5A and 5B and side surfaces of the vibrator portions thereof;

FIG. 11 is a block diagram showing a basic structure associated with FIG. 10.

DETAILED DESCRIPTION OF THE PREFERRED EMBODIMENTS

Figure 1A:
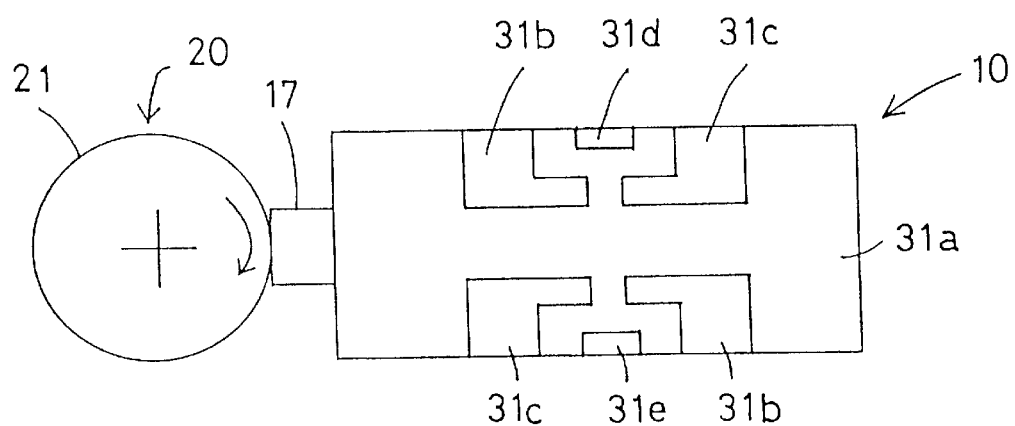
FIG. 1A is an explanatory view showing a planar structure of a first embodiment wherein the present invention has been applied to an ultrasonic motor.

Namely, the ultrasonic motor according to the present invention comprises a piezoelectric flexing vibration member that makes its flexing vibration due to the application of a voltage, and a piezoelectric stretching vibration member that is integrally laminated on the piezoelectric flexing vibration member and makes its stretching vibration due to the application of a voltage.

A movable body is moved by a synthetic vibration of the flexing vibration of the piezoelectric flexing vibration member and the stretching vibration of the piezoelectric stretching vibration member.

As a function of the above-described invention, since the vibration movement is not limited and the vibration direction is kept fixed by retaining the piezoelectric flexing vibration member and piezoelectric stretching vibration member without using fixing means, loss of the vibration movement and dispersion in the vibration direction of each piezoelectric vibration member is prevented.

Furthermore, since the stretching movement can be forcedly induced by providing the piezoelectric stretching vibration member, it is possible to make the stretching vibration large, and the output of the synthetic vibration of this stretching vibration and the flexing vibration becomes high compared to that which is obtained from a laminate of the respective piezoelectric vibration members each making its dual-mode vibration.

Moreover, from the viewpoint of commonly using a reference, decreasing the number of electrodes and simplifying the apparatus construction, the invention is further characterized in that claim 1 by comprising a first electrode that is provided on at the portion of surfaces opposing lamination surfaces of the piezoelectric flexing vibration member in which the piezoelectric flexing vibration member is to be polarization processed, a second electrode is provided on the portion of surfaces opposing lamination surfaces of the piezoelectric stretching vibration member in which the piezoelectric stretching vibration member is to be polarization processed, and a reference electrode is provided at a lamination surface between the piezoelectric flexing vibration member and the piezoelectric stretching vibration member and serves as a reference for the first electrode and the second electrode.

As a function of the above-described invention, the piezoelectric flexing vibration member is flexure vibrated by the application of a voltage between the first electrode and the reference electrode, and the piezoelectric stretching vibration member is stretching vibrated by the application of a voltage between the second electrode and the reference electrode, whereby a movable body is moved by the resulting synthetic vibration.

Moreover, from the viewpoint of simplifying exciting means for exciting respective electrodes and simplifying the apparatus construction, the invention further comprises an electrode wiring member that has an electrode surface for exciting the respective electrodes and that is further integrally laminated on the piezo electric flexing vibration member or piezoelectric stretching vibration member.

As a function of the above-described invention, since the respective electrodes are excited by supplying electric current to only the electrode surface of the electrode wiring member, there is no need to individually wire the respective electrodes, and the piezoelectric flexing vibration member and the piezoelectric stretching vibration member can be polarization processed at one time.

From the viewpoint of increasing the output of the flexing vibration, the invention further comprises another piezoelectric flexing vibration member integrally laminated on the piezoelectric flexing vibration member.

As a function of the above-described invention, a movable body is moved by the large synthetic vibration resulting from the flexing vibration based on the use of the two piezoelectric flexing vibration members.

From the viewpoint of increasing the output of the stretching vibration, the invention further comprises another piezoelectric stretching vibration member integrally laminated on the piezoelectric stretching vibration member.

As a function of the above-described invention, a movable body is moved by the large synthetic vibration resulting from the flexing vibration based on the use of the two piezoelectric stretching vibration members.

In another embodiment, the invention to further comprises a pair of piezoelectric flexing vibration members or a pair of piezoelectric stretching vibration members that are further integrally laminated on the laminated piezoelectric flexing vibration member or piezoelectric stretching vibration member.

As a function of the above-described invention, the flexing vibration resulting from the use of a plurality of piezoelectric flexing vibration members and the stretching vibration resulting from the use of a plurality of piezoelectric stretching vibration members are synthesized to thereby obtain a larger synethetic vibration, with the result that a movable body is moved with a high output.

From the viewpoint of obtaining a high output, the invention further comprises a vibration transmission member for transmitting the synthetic vibration of the piezoelectric flexing vibration member and the piezoelectric stretching vibration member.

As a function of the above-described invention the displacement of the synthetic vibration of the piezoelectric flexing vibration member and the piezoelectric stretching vibration member is enlarged by the vibration transmission member.

In another embodiment of the present the invention, the movable body, which is movable in a straight line direction, is linearly moved by the synthetic vibration of the piezoelectric flexing vibration member and the piezoelectric stretching vibration member.

As a function of the above-described invention, pressure contact is made to the movable body and a frictional force is applied thereto with a prescribed timing by the synthetic vibration of the piezoelectric flexing vibration member and the piezoelectric stretching vibration member to thereby linearly move the movable body.

In another embodiment the invention, characterized in the ultrasonic motor as described in claim the movable body, which is freely rotatable, is rotated by the synthetic vibration of the piezoelectric flexing vibration member and the piezoelectric stretching vibration member.

As a function of the above-described invention, pressure contact is made to the movable body and a frictional force is applied thereto with a prescribed timing by the synthetic vibration of the piezoelectric flexing vibration member and the piezoelectric stretching vibration member to thereby rotate the movable body.

In another embodiment of the invention, the ultrasonic motor can be moved on a stationary surface by the synthetic vibration of the piezoelectric flexing vibration member and the piezoelectric stretching vibration member.

As function of the above-described invention, pressure contact is made to the stationary surface and a frictional force is applied therefrom with a prescribed timing by the synthetic vibration of the piezoelectric flexing vibration member and the piezoelectric stretching vibration member, whereby the ultrasonic motor itself is moved.

In another aspect, the invention is directed to an ultrasonic motor-equipped electronic.

As a function of the above-described invention, the electronic apparatus is driven by the output of the ultrasonic motor in the form of a synthetic vibration.

Embodiments which embody the present invention will now be explained in detail with reference to FIGS. 1 to 11.

{First Embodiment}

Figure 1B:
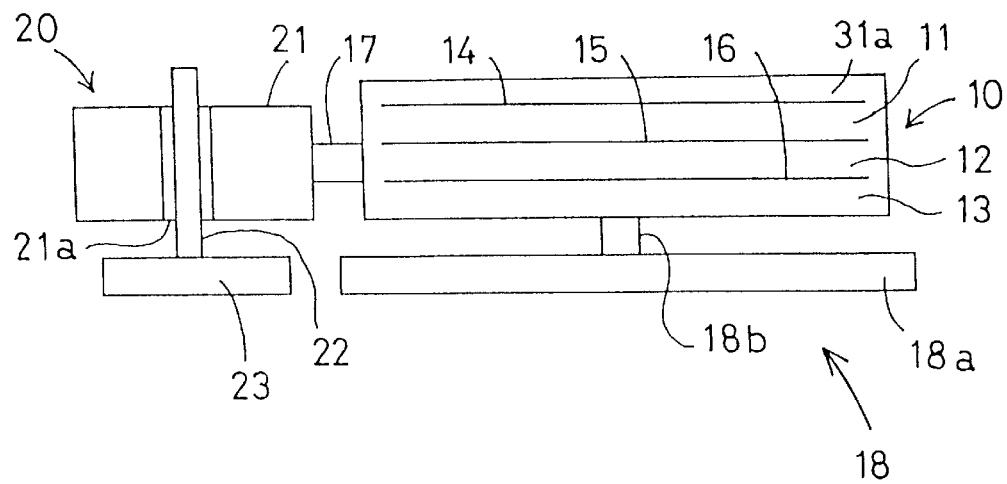
FIG. 1B is an explanatory view showing a sectional structure thereof.

FIGS. 1A and 1B illustrate a first embodiment wherein the present invention has been applied to an ultrasonic motor.

As illustrated in FIGS. 1A and 1B, this embodiment is comprised of a vibrator 10, an output taking member 17 provided on an edge portion of the vibrator 10 and serving as a vibration transmission member of the present invention, a moving body 20 abutted on the output taking member 17 and serving as a movable body of the present invention, and a pressing mechanism 18 for applying pressure to the moving body 20 and the output taking member 17.

The moving body 20 is comprised of a rotating member 21 having a rotating shaft bearing 21a, a fixed member 23 provided in opposed relationship to the rotating member 21, and a rotating shaft 22 installed on the fixed member 23 and passing through the rotating shaft bearing 21a of the rotating member 21.

The output taking member 17 is shaped like a rectangular parallelopiped and is made of material having a rigidity.

The pressing mechanism 18 is comprised of a fixed member 18a provided opposing the vibrator 10, and a pressurizing member 18b for pressurizing the vibrator 10 with respect to the moving body 20.

FIGS. 2A to 2E illustrates planes of respective laminated layers of the vibrator portion and side surface of the vibrator.

As illustrated in FIGS. 2A to 2D, the vibrator portion 10 is comprised of a piezoelectric member 11 that makes its flexing vibration due to the application of a voltage and serving as a piezoelectric flexing vibration member of the present invention, a piezoelectric member 12 that is integrally laminated on the piezoelectric member 11 and makes its stretching vibration and that serves as a piezoelectric stretching vibration member of the present invention, a piezoelectric member 13 that is further integrally laminated on the piezoelectric member 12, an electrode pattern 16 provided between the piezoelectric member 13 and the piezoelectric member 12, an electrode pattern 15 provided between the piezoelectric member 12 and the piezoelectric member 11, an electrode pattern 14 provided at a surface opposing the lamination surface of the piezoelectric member 11 over the piezoelectric member 12, and an electrode wiring member 31 that is integrally laminated on the electrode pattern 14 surface of the piezoelectric member 11 and serves as the electrode wiring member of the present invention.

Figure 2A:
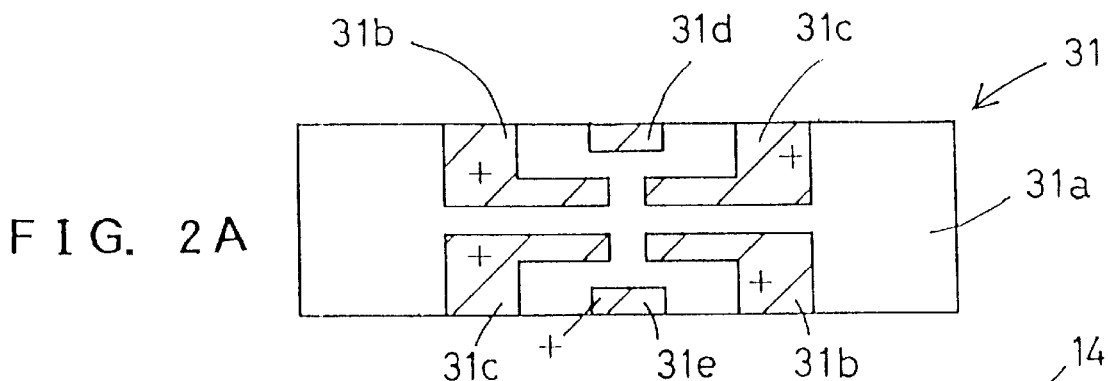
FIGS. 2A,2B,2C,2D and 2E are explanatory views showing planar structures of the respective laminated layers of FIGS. 1A and 1B and side surfaces of the vibrator portions thereof.
Figure 2B:
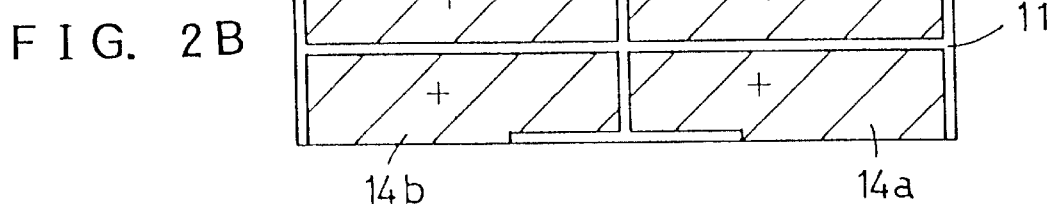
Figure 2C:
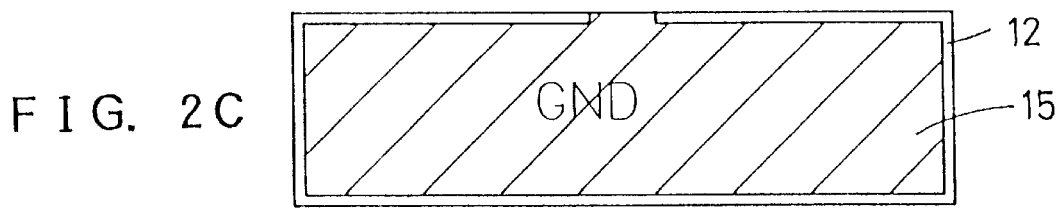

Here, as illustrated in FIGS. 2B and 2C, the piezoelectric members 11 and 12 are each shaped into a rectangular plane, are each fabricated into a dimension for setting a prescribed resonance frequency, and are each made of ferroelectric material such as barium titanate and lead titanate zirconate.

The rectangular piezoelectric member 11 is further divided into four smaller equal parts in the crosswise directions, whereby a pair of the rectangular members arranged in the diagonal direction are polarization processed to the same polarity and a pair of the rectangular members in the side direction are also polarization processed to the same polarity.

On the other hand, the rectangular piezoelectric member 12 is almost wholly polarization processed to the same polarity.

Furthermore, as illustrated in FIG. 2B, the electrode patterns 14a and 14b are fixed in a form of their being kept divided into four parts in correspondence with the polarization processed portions of the piezoelectric member 11 and a pair of the electrodes 14a and a pair of the electrodes 14b as viewed in the diagonal direction are respectively applied with a voltage at the same time.

Furthermore, each of the respective electrode patterns 14a and 14b has provided thereon a protruding portion in such a way that this protruding portion reaches a long edge portion, nearer thereto, of the rectangular surface of the piezoelectric member 11.

As illustrated in FIG. 2C, the electrode pattern 15 is provided on an almost entire region of the rectangular surface of the piezoelectric member 12 and has provided thereon a protruding portion in such a way that this protruding portion reaches the center of one of a pair of long sides of the rectangular surface of the piezoelectric member 12.

Figure 2D:
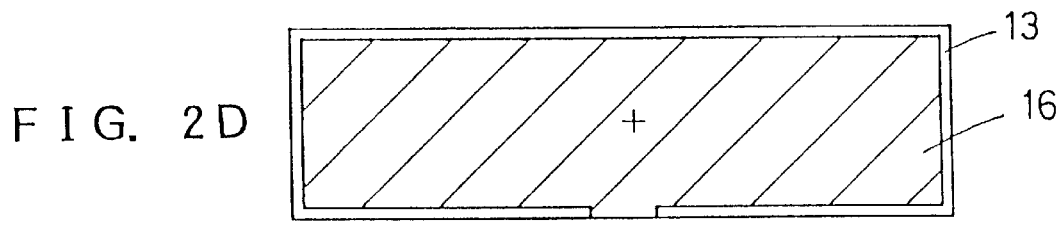

As illustrated in FIG. 2D, the electrode pattern 16 is fixed on an almost entire surface of the piezoelectric member 13 and has provided thereon a protruding portion in such a way that this protruding portion reaches the center of the long edge portion, on a side opposite to that in the case of the electrode pattern 15, of a pair of long sides of the rectangular surface of the piezoelectric member 12.

Figure 2E:
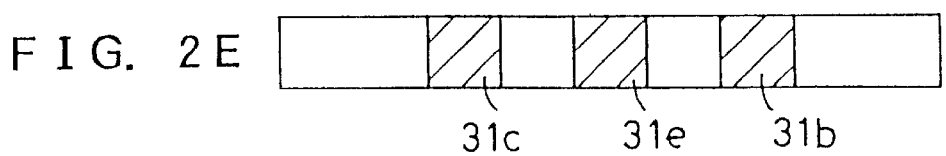

As illustrated in FIGS. 2A and 2E, the electrode wiring member 31 is comprised of a piezoelectric member 31a, and electrode patterns for applying voltage 31b, 31c, 31d and 31e provided on the portions corresponding to the protruding portions of the respective electrode patterns 14, 15 and 16.

The respective electrode pattern for applying voltage 31b reach the long edge portions, nearer thereto, of the rectangular surface and, as illustrated in FIG. 2E, are extended up to the side surfaces of the vibrator 10 and thereby connected to the respective electrode patterns 14.

Next, the method of use of this embodiment will be explained with reference to FIGS. 1 to 4.

Figure 3:
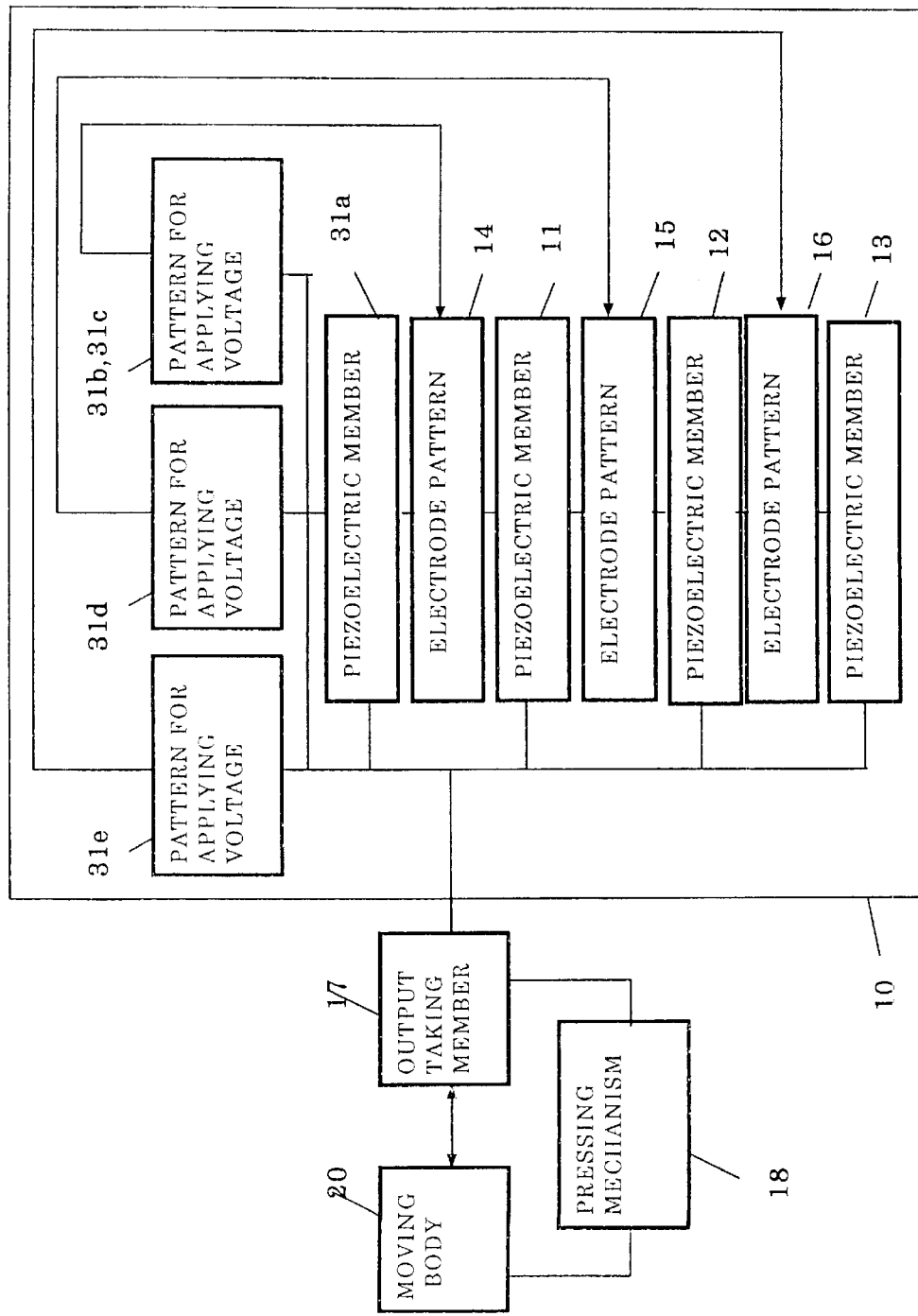
FIG. 3 is a block diagram being associated with FIGS. 1A and 1B.

FIG. 3 is a block diagram illustrating an ultrasonic motor according to this embodiment and FIG. 4 illustrates the modes of vibration of the piezoelectric member according to this embodiment.

First, when wanting to rotate the rotating member 21 of the moving body 20 clockwise, it is sufficient to apply a voltage to the electrode patterns for applying voltage 31b, 31d and 31e as illustrated in FIG. 3.

At this time, the electrode patterns 14a, 15 and 16 are excited. Here, the piezoelectric member 11 between the electrode patterns 14a and 15 is caused to make its flexing vibration in the lateral direction such as that indicated by (A) of FIG. 4 while, on the other hand, the piezoelectric member 12 between the electrode patterns 15 and 16 is caused to make its stretching vibrations in the vertical and lateral directions as indicated by (B) of FIG. 4.

Here, the vibration direction of each piezoelectric member 11 is kept fixed and no limitation is imposed on the vibration movement. Also, since the piezoelectric member 12 is applied with a voltage over an almost entire surface thereof, the piezoelectric member 12 is stretching vibrated largely.

Since the respective piezoelectric members 11 and 12 are made integral with each other, the flexing vibration and stretching vibration of the respective piezoelectric members 11 and 12 are synthesized with the result that the short edge portions of the rectangular surface undergo elliptic movement in the counterclockwise direction.

The output taking member 17 fixed to the short edge portion of the rectangular surface enlarges the elliptic movement and pressure contacts the rotating member 21 of the moving body 20 with a prescribed timing.

Accordingly, the rotating member 21 of the moving body 20 pressure contacted with a prescribed timing receives the frictional force each time it is abutted on, whereby the rotating member 21 is rotated clockwise.

Furthermore, when wanting to rotate the rotating member 21 of the moving body 20 counterclockwise, it is sufficient to apply a voltage to the electrode patterns for applying voltage 31c, 31d and 31e as illustrated in FIG. 3.

At this time, the electrode patterns 14b, 15 and 16 are excited. Here, the piezoelectric member 11 between the electrode patterns 14b and 15 is caused to make its flexing vibration opposite in phase to that indicated by (A) of FIG. 4 while, on the other hand, the piezoelectric member 12 between the electrode patterns 15 and 16 is caused to make its stretching movement such as that indicated by (B) of FIG. 4.

Since the respective piezoelectric members 11 and 12 are made integral with each other, the flexing vibration and stretching vibration of the respective piezoelectric members 11 and 12 are synthesized with the result that the short edge portions of the rectangular surface undergo elliptic movement in the clockwise direction.

Accordingly, the rotating member 21 of the moving body 20 abutted on with a prescribed timing receives the frictional force each time it is abutted on the output taking member 17, whereby the rotating member 21 is rotated counterclockwise.

As described above, according to this embodiment, since it has been arranged that no limitation is imposed onto the vibration movement and the vibration direction is kept fixed by retaining the piezoelectric member 11 without using fixing means, the occurrence of the vibration movement loss and vibration-directional dispersion of each piezoelectric member 11 is prevented.

Furthermore, since the stretching movement is caused forcedly by providing the piezoelectric member, it is possible to make the stretching vibration large, and the output of the synthetic vibration of this stretching vibration and the flexing vibration becomes high compared to that which is obtained from a laminate of the respective piezoelectric members each making its dual-mode vibration.

Furthermore, since it has been arranged that a voltage is applied between the electrode patterns 14 and 15 and between the electrode patterns 15 and 16, the electrode pattern 15 is commonly used as a reference and the apparatus construction is simplified.

Furthermore, since it has been arranged that the respective electrode patterns are excited by supplying electric current to only the electrode surface 31b of the electrode wiring member 31, there is no need to individually wire the respective electrode patterns 14, and the piezoelectric members 11 and 12 can be polarization processed at one time.

Furthermore, since the displacement of the synthetic vibration of the piezoelectric members 11 and 12 is enlarged by the output taking member 17, the rotating member 21 pressure contacted by a forward end of the output taking member 17 is rotated by receiving a greater frictional force.

Furthermore, since the output taking member 17 is brought into pressure contact with the rotating member 21 with a prescribed timing to thereby apply the frictional force thereto by the synthetic vibration of the piezoelectric members 11 and 12, the rotating member 21 is rotated.

{Second Embodiment}

FIG. 5A and 5B illustrate a second embodiment wherein the present invention is applied to an ultrasonic motor.

A main part of this embodiment is comprised, as illustrated in FIGS. 5A and 5B, of a vibrator 10, an output taking member 17 that is provided on an edge portion of the vibrator 10 and serves as a vibration transmission member, a moving body 20 that is abutted on the output taking member 17 and serves as a movable body, and a pressurizing mechanism (not illustrated) for pressurizing the moving body 20 and the output taking member 17.

The moving body 20 has a straight-line movement member 21 that has a guide groove (not illustrated) and linearly moves in a prescribed direction, and a regulation member (not illustrated) that regulates the movement direction of the straight-line movement member 21 by being paired with the guide groove.

The output taking member 17 has a construction similar to that of the first embodiment and is provided on the underside of the vibrator 10 one pair in number at the positions that are equi-distant from the center portion in the rightward and leftward directions.

The pressurizing mechanism has a structure which pressurizes the vibration node portions of the upper surface of the vibrator 10 in the downward direction.

FIGS. 6A to 6H illustrates the planes of the respective laminated layers of the vibrator portion and the side surface thereof.

As illustrated in FIGS. 6A to 6G, the vibrator 10 is comprised of a piezoelectric member 11 that makes its flexing vibration due to the application of a voltage and serving as a piezoelectric flexing vibration member of the present invention, a piezoelectric member 12 that is integrally laminated on the piezoelectric member 11 and makes its stretching vibration and that serves as a piezoelectric stretching vibration member of the present invention, a piezoelectric member 13 that is further integrally laminated on the piezoelectric member 12 and that serves as a piezoelectric stretching vibration member of the present invention, a piezoelectric member 44 that is integrally laminated on the piezoelectric member 13 and that serves as a piezoelectric flexing vibration member of the present invention, a piezoelectric member 45 that is integrally laminated on the piezoelectric member 44 and that serves as a piezoelectric flexing vibration member of the present invention, and a piezoelectric member 46 that is laminated on the piezoelectric member 45.

The vibrator 10 has between the respective piezoelectric members 11 electrode patterns 14 and 48 serving as first electrodes of the present invention, electrode pattern 16 serving as second electrodes of the present invention, electrode patterns 15, 47 and 49 serving as reference electrodes of the present invention, and an electrode wiring member 31 that is laminated on the electrode pattern 14 side of the piezoelectric member 11 and that serves as the electrode wiring member of the present invention.

Here, as illustrated in FIG. 6B, the piezoelectric member 11 has a structure similar to that in the case of the first embodiment and has a characterizing feature in that the rectangular body thereof is divided into four smaller equal rectangular bodies; these rectangular bodies are polarization processed so as to be alternately opposite in polarity to one another; and on one rectangular surface there are provided electrode patterns 14a and 14b in correspondence with the positions at which polarization processing is performed.

Furthermore, every one of the respective electrode patterns 14a and 14b has a protruding portion that reaches one long edge portion.

On the other hand, as illustrated in FIG. 6D, the piezoelectric member 13 is similarly polarization processed vertically reversely from the piezoelectric member 12.

Furthermore, as illustrated in FIGS. 6E and 6F, the piezoelectric members 44 and 45 are polarization processed so that the respective portions thereof which correspond to the polarization processed portions of the piezoelectric member 11 may become opposite in polarity to these polarization processed portions.

Although the electrode pattern 48 provided between the piezoelectric members 44 and 45 has substantially the same construction as that of the electrode pattern 14, the piezoelectric member 45 has provided thereon protruding portions on a side opposite to that on which the electrode pattern 14a has its protruding portion.

As illustrated in FIG. 6A, the electrode wiring member 31 is comprised of a piezoelectric member 31a serving as a main part for applying voltage provided at the positions corresponding to the protruding portions of the electrode patterns 14a and 14b, an electrode pattern for applying voltage 31c provided at the positions corresponding to the protruding portions of electrode patterns 48a and 48b, an electrode pattern 31d provided at the position corresponding to the protruding portion of the electrode patterns 15, 47 and 49, and an electrode pattern for applying voltage 31e provided at the position corresponding to the protruding portion of the electrode pattern 16.

The respective electrode pattern for applying voltage 31b reach the long edge portion, nearer thereto, of the rectangular surface of the piezoelectric member 31a and further are extended up to the side surface of the vibrator portion 10 and thereby connected to the electrode pattern 14.

Next, the method of use of this embodiment will be explained with reference to FIGS. 5 to 8.

Figure 7:
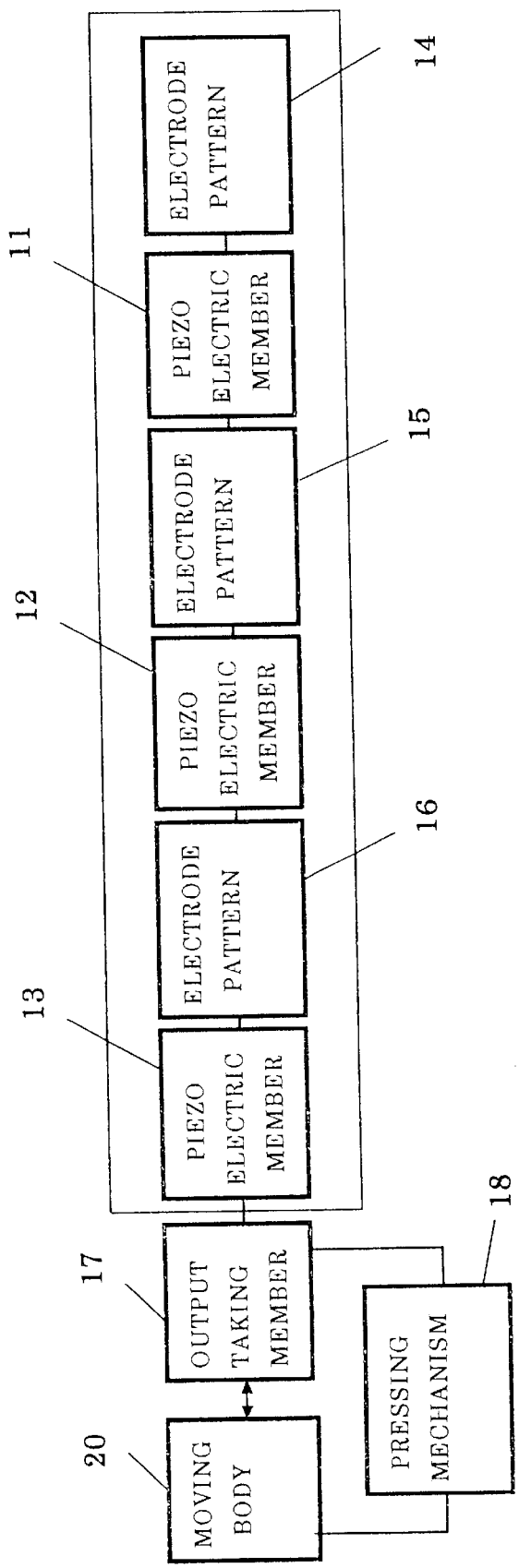
FIG. 7 is a block diagram showing a main part when the movable body associated with FIGS. 5A and 5B is moved leftward.
Figure 8:
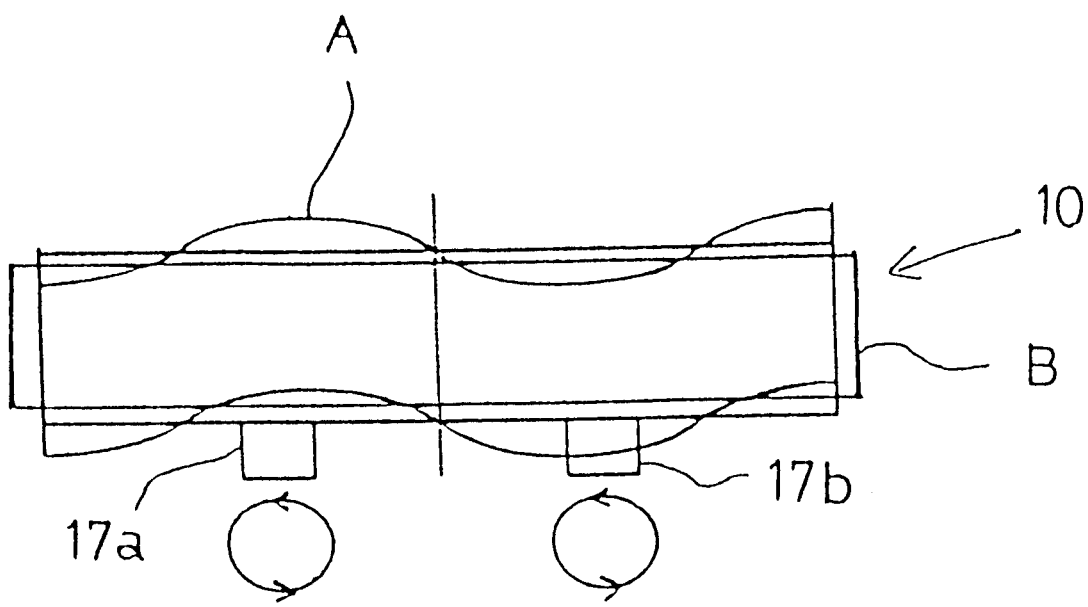
FIG. 8 is an explanatory view showing modes of vibration associated with FIGS. 5A and 5B.

FIG. 7 is a block diagram illustrating a main part when moving the moving body 20 of this embodiment in the leftward direction and FIG. 8 illustrates the operation of the vibrator body portion according to this embodiment.

First, when wanting to linearly move the straight-line movement member 21 of the moving body 20 in the rightward direction, it is sufficient to apply a voltage to the electrode patterns for applying voltage 31c, 31d and 31e as illustrated in FIG. 6A.

At this time, the electrode patterns 15, 16, 48 and 49 are excited, and the piezoelectric members 44 and 45 between the electrode patterns 47, 48 and 49 are caused to make their flexing vibration in the vertical direction as indicated by (A) of FIG. 4 while, on the other hand, the piezoelectric members 12 and 13 between the electrode patterns 15, 16 and 47 are caused to make their stretching vibrations in the vertical and lateral directions as indicated by (B) of FIG. 8.

Since the respective piezoelectric members 44, 45, 12 and 13 are made integral with each other, the flexing vibration and stretching vibration of the respective piezoelectric members 44 are synthesized with the result that the respective portions on the underside of the vibrator body 10 each make their elliptic movements in the counterclockwise direction.

The pair of output taking members 17a and 17b fixed to the underside of the vibrator portion 10 enlarges the elliptic movement and pressure contacts the straight-line movement member 21 of the moving body 20 with a prescribed timing.

Accordingly, the straight-line movement member 21 the moving body 20 which is pressure contacted with a prescribed timing receives the frictional force each time it is abutted on, whereby the member 21 is linearly moved rightward.

When wanting to move the straight-line movement member 21 as the moving body 20 in the leftward direction, it is sufficient to apply a voltage to the electrode patterns for applying voltage 31b, 31d and 31e as illustrated in FIG. 6A.

At this time, as illustrated in FIG. 7, the electrode patterns 14, 15, 16 and 47 are excited, and the piezoelectric members 11, 12 and 13 between the electrode patterns 14 are applied with a voltage.

Here, the piezoelectric member 11 makes its flexing movement whose phase is different by 180° from that of the movement indicated by (A) of FIG. 8 while, on the other hand, the piezoelectric members 12 and 13 between the electrode patterns 15 and 16 are caused to make their stretching vibrations in the vertical and lateral directions as indicated by (B) of FIG. 8.

Furthermore, the respective piezoelectric members 11, 12 and 13 are made integral with each other, and the flexing vibration and stretching vibration of the respective piezoelectric members 11 and 12 are synthesized with the result that the respective portions on the underside of the vibrator body 10 each make their elliptic movements in the clockwise direction.

Accordingly, the straight-line movement member 21 of the moving body 20 which is pressure contacted with a prescribed timing receives the frictional force each time it is abutted on, whereby the member 21 is linearly moved leftward.

As described above, particularly, according to this embodiment, since the piezoelectric members 13 and 45 are further laminated, a large synthetic vibration is obtained with the result that the straight-line 21 is linearly moved with a higher output.

Furthermore, since the output taking member 17 is brought into pressure contact with the straight-line movement member 21 with a prescribed timing to thereby apply the frictional force thereto by the synthetic vibration, the straight-line movement member 21 is linearly moved.

Incidentally, it may be also arranged that the vibrator 10 is pressurized and installed on a stationary surface so as to cause the ultrasonic motor itself to make its linear movement. At this time, the vibrator 10 causes the output taking members 17a and 17b to make their elliptic movements due to the synthetic vibration thereof, whereby the output taking members 17a and 17b receive the frictional force for each abutment onto the stationary surface and the ultrasonic motor itself linearly moves on the stationary surface.

{Third Embodiment}

Figure 9:
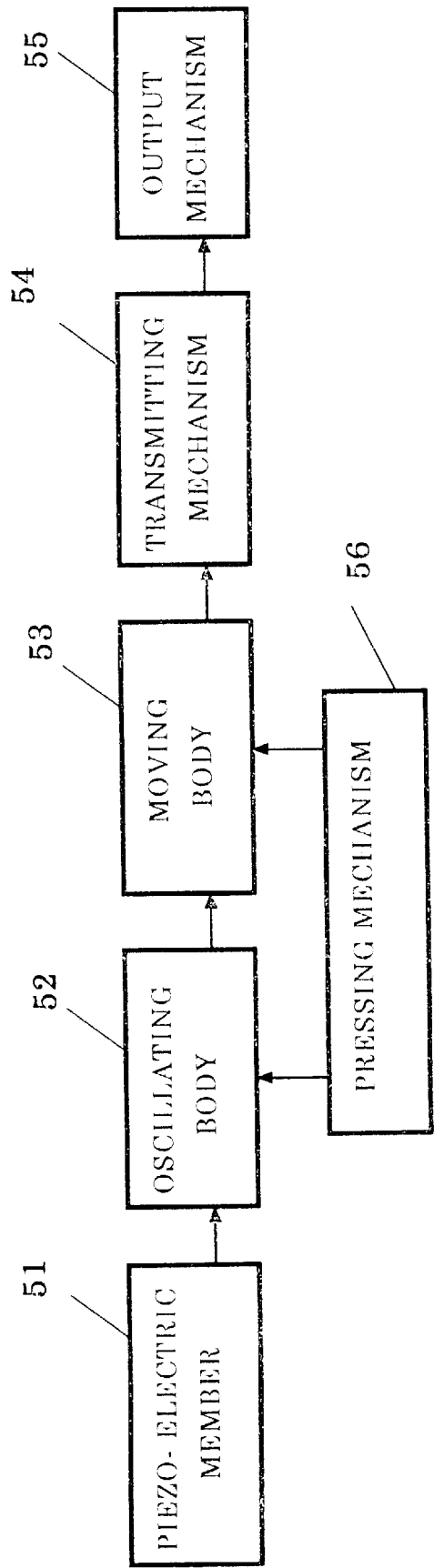
FIG. 9 is an explanatory view showing a third embodiment wherein the present invention has been applied to an electronic appliance.
Figure 10:
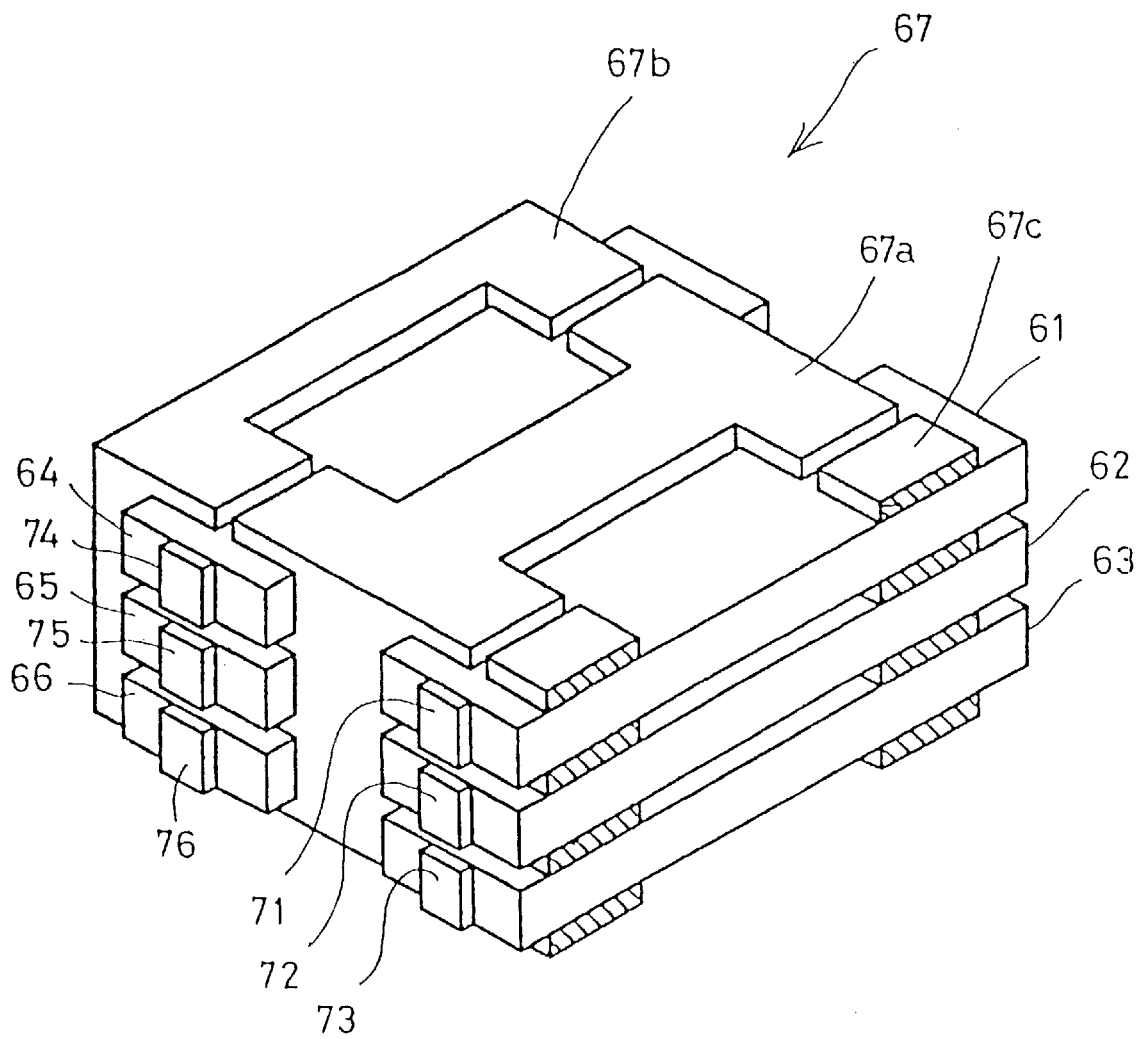
FIG. 10 is an explanatory view showing the structure of an ultrasonic motor having a laminated structure associated with a conventional technique, as viewed from an oblique direction.

FIG. 9 is a block diagram illustrating an embodiment wherein the ultrasonic motor according to the present invention has been applied to an electronic apparatus whose drive source is this ultrasonic motor.

This embodiment is comprised of a laminated type piezoelectric member 51, an oscillating body 52 that is integrally vibrated by the laminated type piezoelectric member 51, a moving body 53 periodically pressure contacted by the vibrator oscillating body 52, a transmitting mechanism 54 that operates integrally with the moving body 53, an output mechanism 55 that can be moved according to the operation of the transmitting mechanism 54, and a pressing mechanism 56 for pressurizing the oscillating body 52 and moving body 53.

Here, as the transmitting mechanism 54 there is a transmission wheel such as a gear train, frictional wheel or the like.

As the output mechanisms 55, there are a shutter driving mechanism, lens driving mechanism or the like in the field of cameras, an indication hand or the like in the field of electronic timepieces or gauges, an arm in the field of robots, and a blade tool feeding mechanism, machining member feeding mechanism or the like in the field of machine tools.

It is to be noted that, preferably, an electronic timepiece, gauge, camera, printer, printing machine, machine tool, robot, moving device or the like can be realized as an electronic apparatus according to this embodiment.

Further, given a construction in which an output shaft is mounted on the moving body 53 and which has a power transmission mechanism for transmitting the torque from the output shaft, it is possible to realize an ultrasonic motor driven apparatus.

As described above, according to the invention, since it has been arranged that the vibration movement is not limited and the vibration direction is kept fixed by retaining the piezoelectric flexing vibration member and piezoelectric stretching vibration member without using fixing means, the occurrence of the loss of the vibration movement and the dispersion in the vibration direction of each piezoelectric vibration member is prevented.

Furthermore since the stretching movement can be caused forcedly by providing the piezoelectric stretching vibration member, it is possible to make the stretching vibration large, and the output of the synthetic vibration of this stretching vibration and the flexing vibration becomes high compared to that which is obtained from a laminate of the respective piezoelectric vibration members each making its dual-mode vibration.

According to the invention, since a voltage is applied between the reference electrode and the first electrode and between the reference electrode and the second electrode, the reference electrode is commonly used as a reference and the apparatus construction is simplified.

According to the invention, since the respective electrodes are excited by supplying electric current to only the electrode surface of the electrode wiring member, there is no need to individually wire the respective electrodes, and the piezoelectric flexing vibration member and the piezoelectric stretching vibration member can be polarization processed at one time.

According to the invention, since it has been arranged that a larger synthetic vibration is obtained by enlarging the flexing vibration, the movable body is moved with a high output.

According to the invention, since it has been arranged that a larger synthetic vibration is obtained by enlarging the stretching vibration, the movable body is moved with a high output.

According to the invention, since larger synthetic vibration is obtained by a plurality of piezoelectric flexing vibration members and a plurality of piezoelectric stretching vibration members, the movable body is moved with an even higher output.

According to the invention, since it has been arranged that the displacement of the synthetic vibration of the piezoelectric flexing vibration member and the piezoelectric stretching vibration member is enlarged by the vibration transmission member, the movable body which is pressure contacted by the vibration transmission member receives a greater frictional force and is thereby moved.

According to the invention, since it has been arranged that the piezoelectric flexing vibration member and the piezoelectric stretching vibration member are pressure contacted, by the synthetic vibration, with the movable body with a prescribed timing to thereby apply a frictional force to it, the movable body is linearly moved.

According to the invention, since it has been arranged that pressure contact is made to the movable body and a frictional force is applied thereto with a prescribed timing by the synthetic vibration, the movable body is rotated.

According to the invention, since it has been arranged that pressure contact is made to the stationary surface and a frictional force is applied therefrom with a prescribed timing by the synthetic vibration, the ultrasonic motor itself is moved on the stationary surface.

According to the invention, the electronic apparatus is driven by the output of the ultrasonic motor in the form of a synthetic vibration.

What is claimed is:

1. An ultrasonic motor comprising: at least one piezoelectric flexing vibration member driven by application of a voltage thereto to undergo flexing vibration; at least one piezoelectric stretching vibration member having a surface integrally laminated on a surface of the piezoelectric flexing vibration member in a lamination direction and driven by application of a voltage thereto to undergo stretching vibration in a direction generally perpendicular to the lamination direction; and a movable body vibrationally driven by a combination of the flexing vibration of the piezoelectric flexing vibration member and the stretching vibration of the piezoelectric stretching vibration member.

2. An ultrasonic motor as claimed in claim 1; further comprising a first electrode disposed on a surface of the piezoelectric flexing vibration member opposite to the surface thereof on which the piezoelectric stretching vibration member is laminated; a second electrode disposed on a surface of the piezoelectric stretching vibration member opposite to the surface thereof on which the piezoelectric flexing vibration member is laminated; and a reference electrode disposed between the piezoelectric flexing vibration member and the piezoelectric stretching vibration member.

3. An ultrasonic motor as claimed in claim 2; further comprising an electrode pattern integrally laminated on one of the piezoelectric flexing vibration member and the piezoelectric stretching vibration member for exciting the first and second electrodes.

4. In an electronic apparatus having an output mechanism for producing an output motion, an ultrasonic motor as claimed in claim 3 for driving the output mechanism to produce the output motion.

5. In an electronic apparatus having an output mechanism for producing an output motion, an ultrasonic motor as claimed in claim 2 for driving the output mechanism to produce the output motion.

6. An ultrasonic motor as claimed in claim 1; wherein the at least one piezoelectric flexing vibration member comprises a plurality of piezoelectric flexing vibration members integrally laminated to one another.

7. In an electronic apparatus having an output mechanism for producing an output motion, an ultrasonic motor as claimed in claim 6 for driving the output mechanism to produce the output motion.

8. An ultrasonic motor as claimed in claim 1; wherein the at least one piezoelectric stretching vibration member comprises a plurality of piezoelectric stretching vibration members integrally laminated to one another.

9. In an electronic apparatus having an output mechanism for producing an output motion, an ultrasonic motor as claimed in claim 8 for driving the output mechanism to produce the output motion.

10. An ultrasonic motor as claimed in claim 1; wherein the at least one piezoelectric stretching vibration member comprises a plurality of piezoelectric stretching vibration members integrally laminated on the piezoelectric flexing vibration member.

11. In an electronic apparatus having an output mechanism for producing an output motion, an ultrasonic motor as claimed in claim 10 for driving the output mechanism to produce the output motion.

12. An ultrasonic motor as claimed in claim 1; further comprising a vibration transmission member for transmitting the combined vibration of the piezoelectric flexing vibration member and the piezoelectric stretching vibration member to the movable body.

13. In an electronic apparatus having an output mechanism for producing an output motion, an ultrasonic motor as claimed in claim 12 for driving the output mechanism to produce the output motion.

14. An ultrasonic motor as claimed in claim 1; further comprising driving means for driving the piezoelectric flexing vibration member and the piezoelectric stretching vibration member to undergo flexing vibration and stretching vibration, respectively, to thereby linearly drive the movable body.

15. In an electronic apparatus having an output mechanism for producing an output motion, an ultrasonic motor as claimed in claim 8 for driving the output mechanism to produce the output motion.

16. An ultrasonic motor as claimed in claim 1; further comprising driving means for driving the piezoelectric flexing vibration member and the piezoelectric stretching vibration member to undergo flexing vibration and stretching vibration, respectively, to thereby rotationally drive the movable body.

17. In an electronic apparatus having an output mechanism for producing an output motion, an ultrasonic motor as claimed in claim 9 for driving the output mechanism to produce the output motion.

18. An ultrasonic motor as claimed in claim 1; further comprising a stationary surface supporting the ultrasonic motor; and wherein the ultrasonic motor is driven on the stationary surface by the combined vibration of the piezoelectric flexing vibration member the piezoelectric stretching vibration member.

19. In an electronic apparatus having an output mechanism for producing an output motion, an ultrasonic motor as claimed in claim 18 for driving the output mechanism to produce the output motion.

20. An ultrasonic motor as claimed in claim 1; wherein the at least one piezoelectric flexing vibration member comprises a plurality of piezoelectric flexing vibration members integrally laminated on the piezoelectric stretching vibration member.

21. In an electronic apparatus having an output mechanism for producing an output motion, an ultrasonic motor as claimed in claim 1 for driving the output mechanism to produce the output motion.

22. An ultrasonic motor comprising: at least one first piezoelectric vibration member for undergoing flexing vibration; at least one second piezoelectric vibration member laminated in a lamination direction to the first piezoelectric vibration member for undergoing stretching vibration in a direction generally perpendicular to the lamination direction; a movable member connected to the first and second piezoelectric vibration members to be frictionally driven by a combination of the flexing vibration and the stretching vibration of the first piezoelectric vibration member and the second piezoelectric vibration member, respectively; and driving means for generating a voltage signal to vibrationally drive the first and second piezoelectric vibration members to undergo flexing vibration and stretching vibration, respectively.

23. An ultrasonic motor as claimed in claim 22; wherein the at least one first piezoelectric vibration member comprises a plurality of first piezoelectric vibration members; and wherein the at least one second piezoelectric vibration member comprises a plurality of second piezoelectric vibration members laminated to the first piezoelectric vibration members.

24. In an electronic apparatus having an output mechanism for producing an output motion, an ultrasonic motor as claimed in claim 22 for driving the output mechanism to produce the output motion.

* * * * *